United States Patent [19]
Yamamoto

[11] Patent Number: 4,581,556
[45] Date of Patent: Apr. 8, 1986

[54] DOUBLE THICKNESS MODE ENERGY TRAPPED PIEZOELECTRIC RESONATING DEVICE

[75] Inventor: Takashi Yamamoto, Ishikawa, Japan

[73] Assignee: Murata Manufacturing Co., Ltd., Japan

[21] Appl. No.: 642,809

[22] Filed: Aug. 21, 1984

[30] Foreign Application Priority Data

Aug. 30, 1983 [JP] Japan .................. 58-159676

[51] Int. Cl.$^4$ .................................... H01L 41/08
[52] U.S. Cl. .................................... 310/320; 310/366
[58] Field of Search .................. 310/320, 366, 365; 333/187–191

[56] References Cited

U.S. PATENT DOCUMENTS

| | | | |
|---|---|---|---|
| 3,697,788 | 10/1972 | Parker et al. | 310/320 |
| 4,356,421 | 10/1982 | Shimizu et al. | 310/320 |
| 4,365,181 | 12/1982 | Yamamoto | 310/320 |
| 4,469,976 | 9/1984 | Scott | 310/365 |
| 4,481,488 | 11/1984 | Dworsky | 310/320 X |

OTHER PUBLICATIONS

*Quartz Uni-Wafer Filters, A Thin Film Device*, by D. R. Curren et al., Electronic Research Division, Clevite Corp., Clev. Ohio, 1964.
Western Electronic Show and Convention, Aug. 25–28, 1964, (seven pages).

*Primary Examiner*—Mark O. Budd
*Attorney, Agent, or Firm*—Ostrolenk, Faber, Gerb & Soffen

[57] ABSTRACT

A piezoelectric resonating device utilizes double thickness vibration mode of the energy-trapped type and comprises a piezoelectric plate, input and output electrodes disposed at one surface of the piezoelectric plate and a common ground electrode disposed at the other surface of the plate. The common ground electrode is disposed to face against the input and output electrodes and the input and output electrodes are formed by a plurality of electrode segments. A plurality of piezoelectric resonating segments are coupled together each comprising the respective electrode segments and the common ground electrode.

5 Claims, 8 Drawing Figures

DOUBLE THICKNESS MODE ENERGY TRAPPED PIEZOELECTRIC RESONATING DEVICE

FIELD OF THE INVENTION

This invention relates to a piezoelectric resonating device utilizing double thickness vibration mode of the energy-trapped type.

DESCRIPTION OF THE PRIOR ART

In the past, piezoelectric resonating devices utilizing double thickness vibration mode of the energy-trapped type were used as filters, FM discriminators and the like. A plan view of a piezoelectric filter of conventional piezoelectric resonating devices related to the present invention is provided by FIG. 1. The piezoelectric filter 1 comprises a piezoelectric plate 5 bearing at its front surface an input electrode 2 and an output electrode 3 opposed to one another and a common ground electrode 4 located on the back surface of the plate 5.

It is well known that the width of the pass band of the piezoelectric filter 1 is determined by polarizability, the inherent coupling coefficient of material of the piezoelectric plate 5, the sizes of the respective electrodes 2, 3 and 4 and the gap g between the input and output electrodes (see FIG. 1). The most important factor to affect the band width is the gap g between the input and output electrodes. To attain a wide band filter, the gap g between the input and output electrodes should be as small as possible. A fractional band width ranging from 0.9 to 3.5% is available with the conventional squeeze printing. The fractional band width is the value obtained by dividing the 3db band width value by the center frequency of a filter. However, to attain a piezoelectric filter with a wider band width, photoetching is used as a more effective substitute for the squeeze printing. Photoetching also undergoes a lower limit of the gap g between the input and output electrodes, with 4.5% of upper limit of the fractional band width. Nevertheless, there is a strong demand for wider pass band widths for practical applications. Photoetching has the disadvantages that it is not as useful for achieving appropriate band widths, in that it requires expensive facilities and is therefore unsuitable for mass production.

Conventionally, the demand for wider band widths is satisfied by using an LC tuning circuit. Although it provides an improvement in fractional band width, the LC tuning circuit suffers from the shortcomings that it needs sophisticated tuning, becomes bulky and adversely affects magnetic lines of force in its surrounding circuits due to the presence of a magnetic core at its center.

SUMMARY OF THE INVENTION

It is an object of the present invention to provide a piezoelectric resonating device of a wider band characteristic which overcomes the foregoing shortcomings and which is manufacturable with existing materials and facilities.

In a broad aspect of the present invention, there is provided a piezoelectric resonating device utilizing double thickness vibration mode of the energy-trapped type. The resonating device comprises a piezoelectric plate bearing at its one surface an input electrode and an output electrode which are opposed to each other and a common ground electrode facing both the input and output electrodes on the other back surface of the plate. The piezoelectric resonating device is characterized in that the input and output electrodes comprise a plurality of interleaved electrode segments and a plurality of piezoelectric resonating segments each comprising the respective electrode segment and in that the common ground electrode are coupled with each other.

With such an arrangement, the present invention provides a peizoelectric resonating device of an extended pass band width which is manufacturable with known materials and with existing manufacturing facilities and methods.

According to a specific aspect of the present invention, there are provided input and output terminals adjacent an edge of one surface of the piezoelectric plate and a common ground terminal adjacent an edge of the other surface.

The common ground electrode may be formed of a plurality of electrode segments or a single electrode.

The foregoing and other objects, features, aspects and advantages of the present invention will become more apparent from the following detailed description of the present invention when taken in conjunction with the accompanying drawings.

DESCRIPTION OF THE PREFERRED EMBODIMENT

Figure 2:
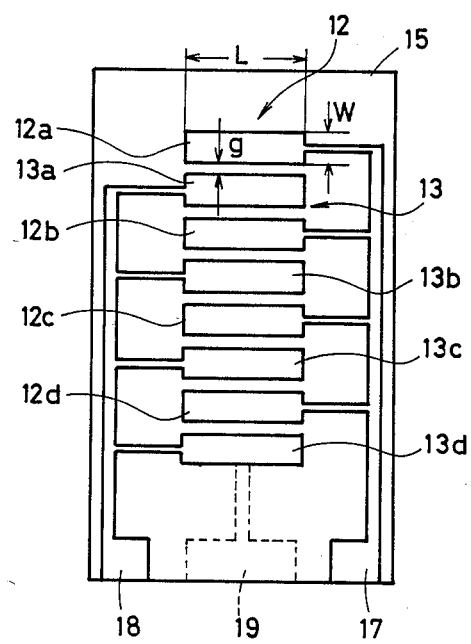
FIGS. 2 and 3 are a plan view and a bottom view of a piezoelectric resonating device according to an embodiment of the present invention.
Figure 3:
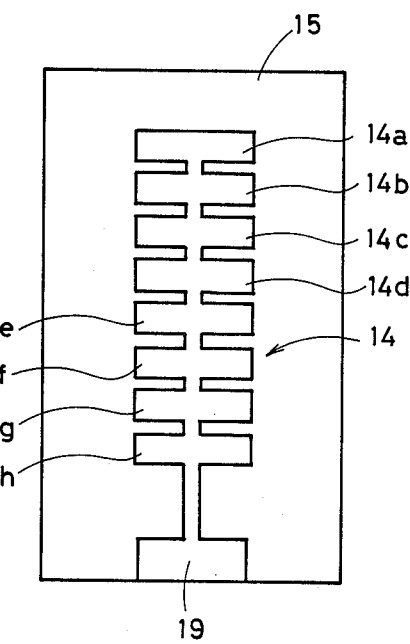

FIGS. 2 and 3 are, respectively, a plan view and a bottom view of an embodiment of the present invention. An important feature of the present invention lies in a specific configuration of an input electrode 12 and an output electrode 13 disposed on one surface of a piezoelectric plate 15. The input electrode 12 and output electrode 13 are respectively formed of a plurality of interleaved electrode segments 12a, 12b, 12c, 12d and 13a, 13b, 13c, 13d. The respective electrode segments 12a, 12b, 12c, 12d of the input electrode 12 are interleaved with the respective electrode segments 13a, 13b, 13c, 13d of the output electrode 13. It is obvious from FIG. 2 that the respective electrode segments 12a, 12b, 12c, 12d and 13a, 13b, 13c, 13d are connected in parallel and led out through an input terminal 17 and an output terminal 18.

As is seen from FIG. 3, disposed on the other surface of the piezoelectric plate 15 is a common ground electrode 14 which is likewise formed by a plurality of electrode segments 14a . . . 14h. The respective electrode segments 14a . . . 14h are sized and positioned in such a manner that they face, across the plate 15, the respective electrode segments 12a ... 12d and 13a ... 13d. Furthermore, the respective common electrode segments 14a ... 14h are commonly connected and led to a common ground terminal 19.

The embodiment as illustrated in FIGS. 2 and 3 can function as a filter with 10.7 MHz center frequency, wherein the respective electrode segments are sized with W=0.4 mm, L=0.8 mm and g=0.2 mm. It is therefore possible to make the respective electrodes 12, 13 and 14 by the conventional squeeze printing method without the need for expensive facilities or special manufacturing techniques. It is further possible to make the piezoelectric plate 15 and the respective electrode segments with the conventional materials without substantial expenditures of money and time for development of materials.

Figure 1:
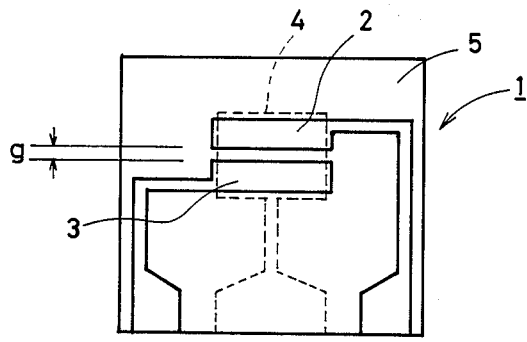
FIG. 1 is a plan view of a piezoelectric filter of conventional piezoelectric resonating devices.
Figure 4:
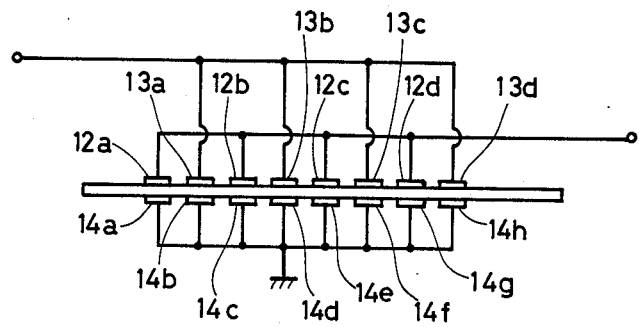
FIG. 4 is a schematic side view of the manner in which the embodiment as shown in FIGS. 2 and 3 is interconnected.

The advantage offered by the embodiment illustrated in FIGS. 2 and 3 will be discussed below. FIG. 4 is a schematic side view which shows how the segments in the embodiment of FIGS. 2 and 3 are interconnected. As is clear from FIG. 4, a plurality of piezoelectric resonating segments are coupled together each comprising the respective one of the electrode segments of the input and output electrodes 12 and 13 and that of the common ground electrode 14. For example, upon viewing a pair of the electrode segments 12b and 14c, it is understood that the pair is coupled with the two adjoining electrode pairs 13a - 14b and 13b - 14d. It should however be noted that the conventional piezoelectric filter 1 of FIG. 1 relies upon nothing but coupling between the two pairs of the electrodes, that is, one between the input electrode 2 and the portion of the common ground electrode 4 which faces against to the input electrode 2 and the other between the output electrode 3 and the portion of the common ground electrode 4 which faces against to the output electrode 3. A comparison between the illustrated embodiment and the conventional piezoelectric filter shows that the coupling coefficient of the former is twice that of the latter. It is well known that the electro-mechanical coupling coefficient K between the input and output electrodes of the piezoelectric filter and the fractional band width B are correlated as BαK. If the input and output electrodes are configured as in the above embodiment while the other factors which affect the fractional band width remain unchanged, the fractional band width of the illustrated embodiment becomes theoritically twice as wide as that of the conventional pioezoelectric filter.

Figure 5:
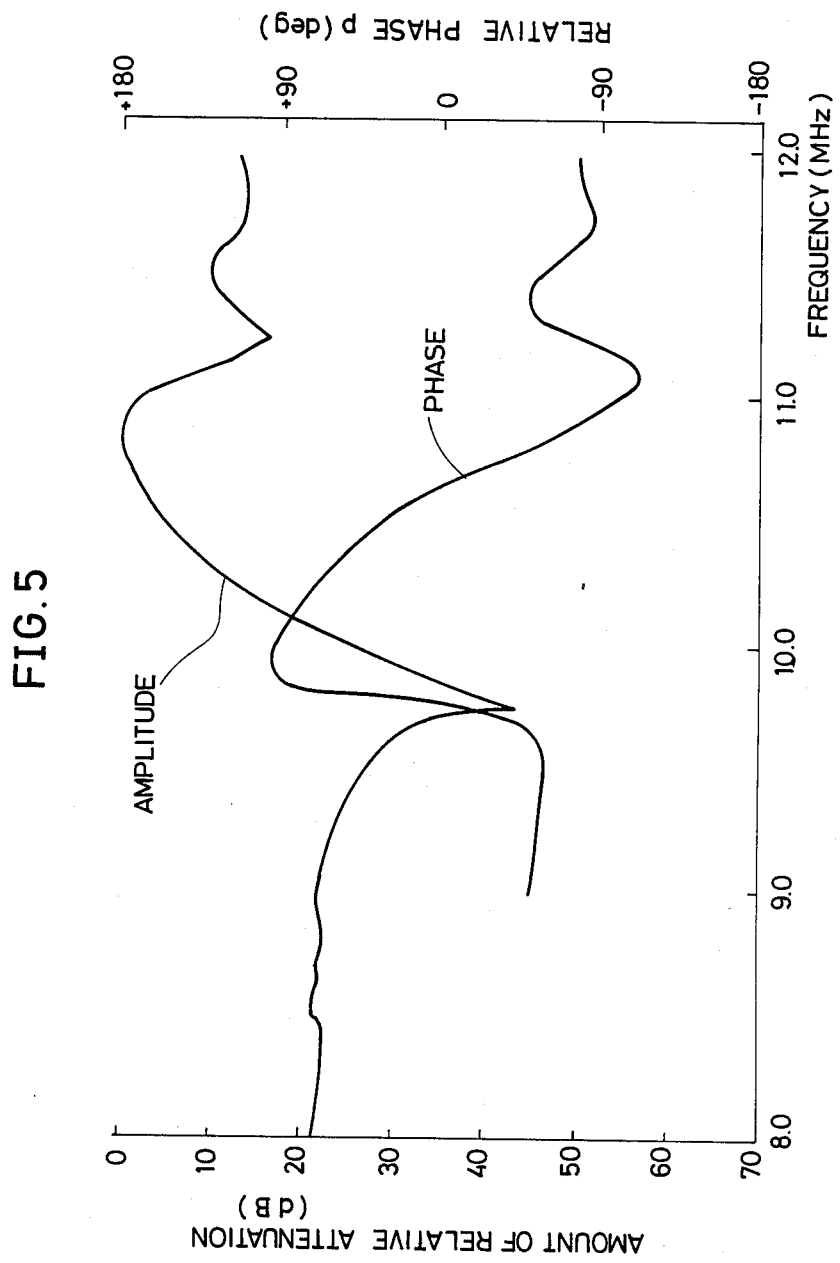
FIG. 5 is a plot of the amplitude and phase characteristics of the conventional piezoelectric filter.
Figure 6:
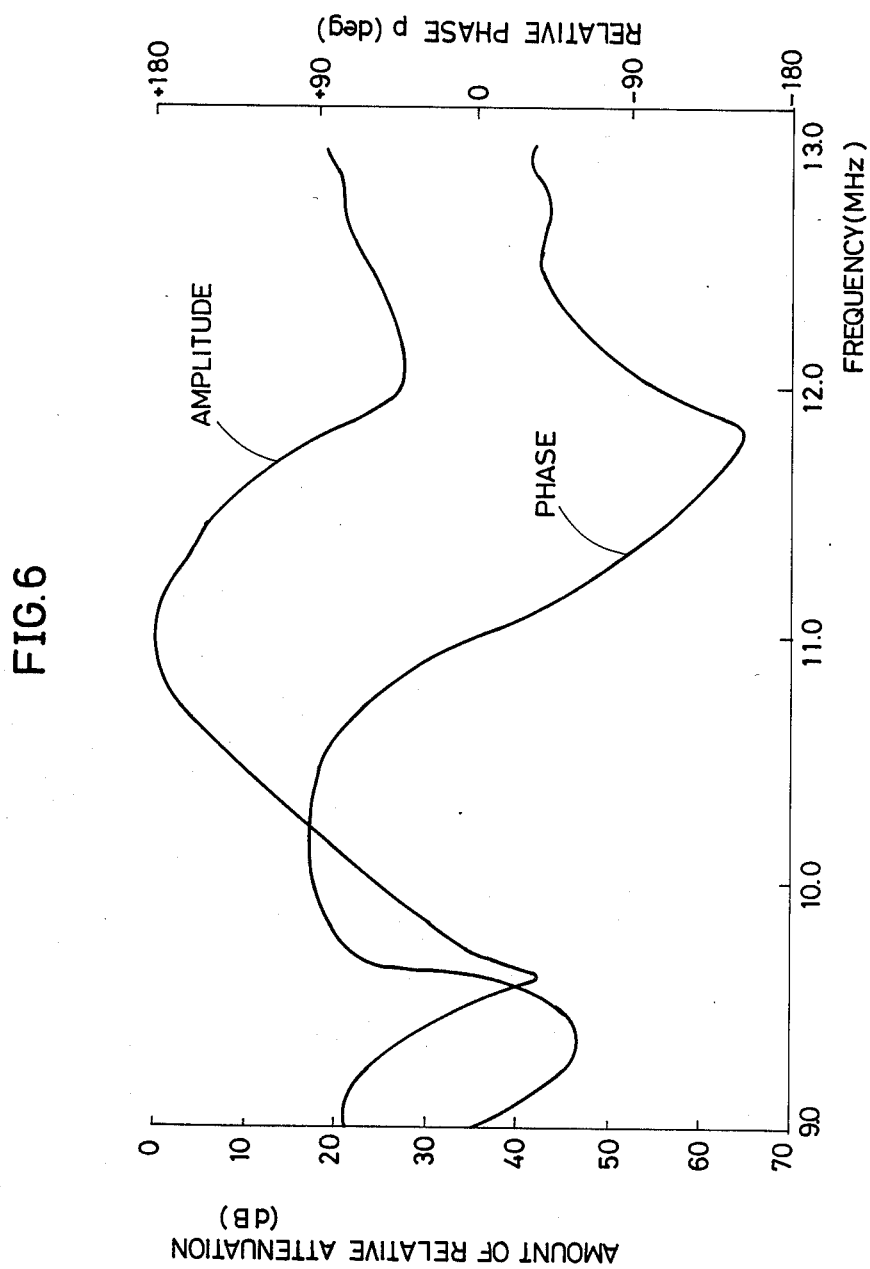
FIG. 6 is a plot of the amplitude and phase characteristics of the embodiment of FIGS. 2 and 3.

The characteristics of the embodiment of FIGS. 2 and 3 are compared to the conventional piezoelectric filter which is manufactured by photoetching with 0.05 mm gap g between the input and output electrodes. FIG. 5 is a plot showing the amplitude and phase characteristics of the conventional piezoelectric filter, while FIG. 6 is a plot showing the amplitude and phase characteristics of the piezoelectric filter according to the embodiment of FIGS. 2 and 3. The results of measurements of the characteristics of the two filters are summarized in the following table.

TABLE

| | electrode pair | insertion loss | 3 dB BW (A) | 10 dB BW (B) | center frequency (C) | fractional band width (A)/(C) × 100 |
|---|---|---|---|---|---|---|
| conventional filter (photoetching) | 1 | 1.1 (dB) | 460 (kHz) | 830 (kHz) | 10.7 (MHz) | 4.3 (%) |
| filter of the invention | 4 | 0.9 (dB) | 720 (kHz) | 1160 (kHz) | 10.7 (MHz) | 6.7 (%) |

It is evident from the foregoing table that the fractional band width of the embodiment is nearly 1.56 times as wide as that of the conventional piezoelectric filter fabricated by photoetching, with a remarkable extension of its pass band width. Upon comparison between the phase characteristics in FIGS. 5 and 6, it is further clear that the piezoelectric filter in the embodiment exhibits a linearity of phase variation within a wider range than does the conventional one. The piezoelectric filter is thus suited for a phase detecting type FM demodulator.

Figure 7:
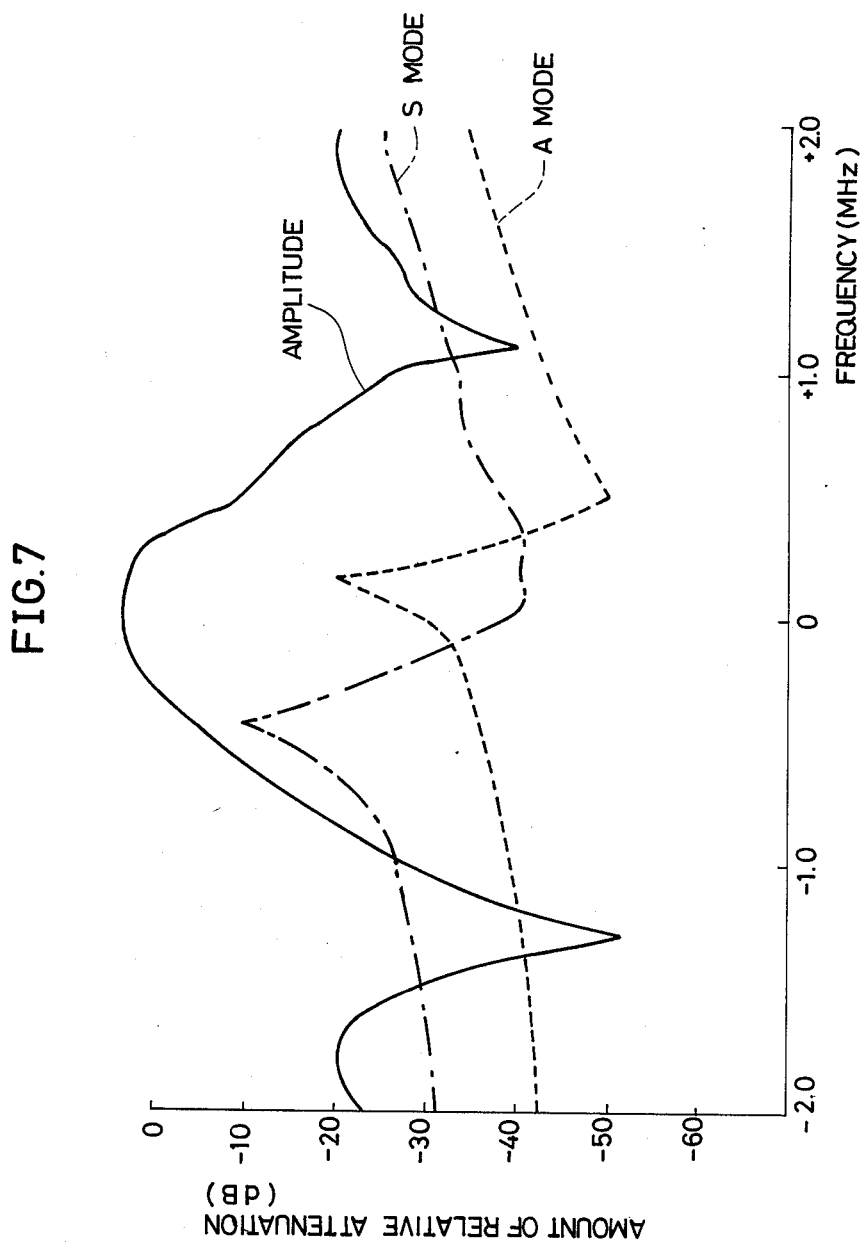
FIG. 7 is a plot representing the vibration mode of the embodiment of FIGS. 2 and 3.

In addition, the embodiment of FIGS. 2 and 3 demonstrates a double mode property of symmetric mode (S mode) and antisymmetric mode (A mode) as shown in FIG. 7, thus permitting handling of the filter in a manner similar to the conventional piezoelectric filter.

Figure 8:
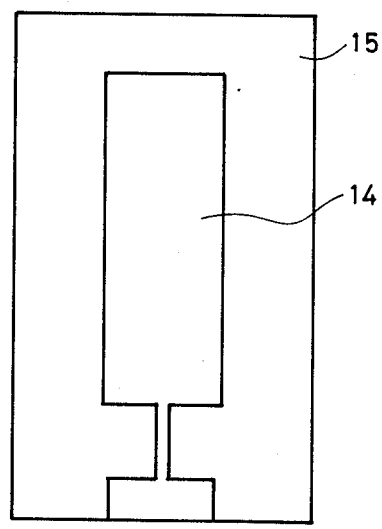
FIG. 8 is a bottom view showing another example of a common ground electrode.

Although in the embodiment as shown in FIGS. 2 and 3 the common ground electrode 14 is similarly constituted by the plurality of the electrode segments 14, the present invention should not be limited thereto and particularly the common ground electrode 14 may be formed by a single electrode segment as long as it is juxtaposed to the respective electrode segments of the input and output electrodes on both the surfaces of the piezoelectric plate as depicted in FIG. 8, for example.

It is to be pointed out that the present invention is applicable not only to filters but also to a wide variety of piezoelectric resonating devices such as discriminators and the like.

Although the present invention has been described and illustrated in detail with reference to a preferred embodiment, it is clear that the same is by way of illustration and example only and is not to be taken by way of limitation. The spirit and scope of the present invention being limited only by the terms of the appended claims.

What is claimed is:

1. A piezoelectric resonating device of the double thickness vibration mode trapped energy type, said device comprising:

a piezoelectric plate having a front face and an opposite back face;

an input electrode and an output electrode on said front face, each one of said electrodes comprising a plurality of electrically interconnected electrode segments, said electrode segments being arranged to follow one another generally along one direction of said front face, said input and output electrode segments being aligned and interleaved with one another such that each input electrode segment is adjacent to at least one output electrode segment;

a common ground electrode located on said back face of said plate and juxtaposed to said input and output electrodes; and an input terminal and an output terminal located adjacent one edge of said plate, interconnection means for electrically interconnecting said input electrode segments to said input terminal and said output electrode segments to said output electrode, portions of said interconnecting means which contact said input electrode segments extending generally in an opposite direction to another portion of said interconnecting means which is used for contacting said output segments.

2. A piezoelectric resonating device as set forth in claim 1 wherein said common ground electrode comprises a plurality of electrode segments each of which is juxtaposed to a respective one of sid electrode segments of said input and output electrodes.

3. A piezoelectric resonating device as set forth in claim 1 wherein said common ground electrode comprises a single electrode segment which is juxtaposed to said input and output electrodes.

4. A piezoelectric resonating device as set forth in claim 2 wherein said plurality of electrode segments of said input and output electrodes and said plurality of electrode segments of said common ground electrode are similarly shaped.

5. A piezoelectric resonating device as set forth in claim 3 wherein said plurality of electrode segments of said input and output electrodes are similarly shaped.

* * * * *